(12) United States Patent
Williams

(10) Patent No.: US 6,417,997 B1
(45) Date of Patent: Jul. 9, 2002

(54) MECHANICALLY FORMED STANDOFFS IN A CIRCUIT INTERCONNECT

(76) Inventor: Stephen P. Williams, 15035 Sycamore Dr., Morgan Hill, CA (US) 95037

( * ) Notice: Subject to any disclaimer, the term of this patent is extended or adjusted under 35 U.S.C. 154(b) by 0 days.

(21) Appl. No.: 09/865,814

(22) Filed: May 25, 2001

Related U.S. Application Data

(62) Division of application No. 09/258,011, filed on Feb. 25, 1999, now Pat. No. 6,246,548, which is a division of application No. 08/822,527, filed on Mar. 24, 1997, now abandoned.

(51) Int. Cl.[7] .............................. G11B 5/48; H05K 3/34
(52) U.S. Cl. .............................. 360/245.8; 360/264.2; 29/840; 439/67
(58) Field of Search .................. 360/245.8, 245.9, 360/264.2, 266.3; 361/767, 768, 773, 774; 257/736–738, 772; 228/180.22; 205/78; 439/67, 74, 493; 29/846, 848–849, 831, 874, 840

(56) References Cited

U.S. PATENT DOCUMENTS

| | | | |
|---|---|---|---|
| 4,453,795 A | | 6/1984 | Moulin |
| 4,761,699 A | | 8/1988 | Ainslie et al. |
| 5,147,208 A | * | 9/1992 | Bachler .................. 439/67 |
| 5,186,383 A | | 2/1993 | Melton et al. |
| 5,197,184 A | | 3/1993 | Crumly et al. |
| 5,207,887 A | | 5/1993 | Crumly et al. |
| 5,245,750 A | | 9/1993 | Crumly et al. |
| 5,269,453 A | | 12/1993 | Melton et al. |
| 5,324,890 A | | 6/1994 | Lawlyes |
| 5,354,205 A | | 10/1994 | Feigenbaum et al. |
| 5,410,184 A | | 4/1995 | Melton et al. |
| 5,525,065 A | | 6/1996 | Sobhani |
| 5,646,067 A | * | 7/1997 | Gaul .......................... 437/180 |
| 5,747,358 A | | 5/1998 | Gorrell et al. |
| 5,818,697 A | | 10/1998 | Armezzani et al. |
| 5,855,063 A | | 1/1999 | Schreiber et al. |
| 6,246,548 B1 | * | 6/2001 | Williams .................. 360/245.8 |

* cited by examiner

Primary Examiner—Brian E. Miller
(74) Attorney, Agent, or Firm—Steven G. Roeder; James P. Broder

(57) ABSTRACT

Mechanically formed standoffs in a disk drive integrated circuit interconnect reduces the cost of manufacturing and improves the reliability of the electrical interconnections thereof. Connection pads defined along the interconnect are bonded with bonding pads of a signal producing source and a signal processing source. The standoffs provide mechanical stops during the bonding process, enabling sufficient bonding material to form between bonding areas. The standoffs are mechanically formed with a punch and die assembly either directly through a bonding pad predefined along traces on the interconnect or adjacent the bonding pad. The standoffs formed through the bonding pads are covered with solder or other electrically conductive bonding material.

25 Claims, 4 Drawing Sheets

MECHANICALLY FORMED STANDOFFS IN A CIRCUIT INTERCONNECT

CROSS REFERENCE TO RELATED APPLICATIONS

This application is a divisional of Ser. No. 09/258,011 now U.S. Pat. No. 6,246,548, filed Feb. 25, 1999, which in turn is a divisional of U.S. patent application Ser. No. 08/822,527, filed Mar. 24, 1997, now abandoned.

FIELD OF THE INVENTION

The present invention relates generally to standoffs for integrated circuit interconnect assemblies and methods for assembling the standoffs. More specifically, the present invention relates to standoffs mechanically formed onto a flexure/conductor structure for electrically interconnecting a read/write transducer head and a preamplifier integrated circuit assembly of a hard disk drive and the method for forming the standoffs.

BACKGROUND OF THE INVENTION

In the computer industry, there is a constant demand for products that are both less expensive and have higher performance. The hard disk drive used in virtually every personal computer has traditionally been one of the most expensive components installed therein. Thus, disk drive manufacturers have continuously tried to decrease the cost of their drives while at the same time increase the amount of mass storage provided.

As is well known in the art, any rotating mass storage device includes at least one rotating disk, a read/write transducer deposited upon a slider structure, a head positioning assembly and drive electronics. The drive electronics typically include a preamplifier chip and read channel circuitry carried on a circuit board attached to the head/disk assembly. In the past, very small diameter twisted solid wires have typically been used to interconnect the read/write head with the drive electronics. However, there has been a trend in the disk drive industry to integrate the wires with a flexure structure, for improved performance and ease of assembly. Examples of such a configuration is disclosed in U.S. Pat. No. 5,006,946 to Matsuzki and U.S. Pat. No. 5,491,597 to Bennin et al. Such structures typically employ stainless steel flexures having deposited insulating and conductive trace layers and connection pad arrays for electrical interconnection. Each bonding pad of the connection array is typically solder coated.

A representative bonding pad 12 of a typical interconnect 11 is shown in FIG. 1a. An adjacent solder covered bonding pad 14, representing that of a disk drive electronic component 15, is shown. One drawback of this type of solder covered bonding pad occurs during the soldering process, and is illustrated in FIG. 1b. As the solder 13 is liquefied, and the two bonding pads are brought together, the weight of interconnect 11 forces the molten solder out from between the bonding pads due to the lack of a physical gap therein between. The ejected solder creates the detrimental possibility of bridging adjacent joints.

One alternative, which improves upon the solder covered planar bonding pads of FIG. 1a, is a ball-shaped solder bump 22, shown in FIG. 2a. Solder bumps are typically made of conductive metals such as nickel or copper and, as shown in FIG. 2a, covered with solder 23. The solder bump 22 is typically fabricated by using a process known as "electroplating", to build up the conductive material, thereby creating a bump. The bump is then covered with solder. Solder bumps are an improvement over planar bonding pads because, as shown in FIG. 2b, the bump creates a localized high point area so that during the soldering process, a clamping pressure (not shown) can be applied to ensure that the soldered area will contact the adjoining circuit structure 24. In addition, the mechanical portion of the solder bump 22 creates a single point mechanical stop so that when the solder liquefies, the circuits will not come together without a gap therein between. Typically, solder is liquefied or reflowed, by known methods such as thermal conduction or infra-red (IR) heating. As shown in FIG. 2b. after reflow, the bump 22 leaves a gap 28, enabling the solidified solder 13 to form a fillet around the solder bump 22. However, the disadvantage of solder bumps 22 is that its fabrication in the flexure/conductor requires additional manufacturing steps, making the interconnects more expensive. In addition, during processing, contamination in the area where the bump is electroplated can cause weak joints and potential reliability problems. Resulting fractures at the electrical trace and solder bump interface have also been detected, creating reliability concerns.

Other alternative approaches of joining the flexure/conductor structure with drive electronic circuitry include ultrasonically bonding the two circuits and gold ball or aluminum wedge wire bonding. Neither of these approaches are manufacturably desirable because neither approach is reworkable.

Thus, a hitherto unsolved need has remained for a low cost and reliable solder bump which is reworkable.

SUMMARY OF THE INVENTION WITH OBJECTS

A general object of the present invention is to provide a mechanically formed standoff in a circuit interconnect to provide a low cost alternative to solder bumps.

The standoff provides a gap between itself and a corresponding bonding pad, thereby enabling sufficient solder to solidify therein between, resulting in a more reliable joint. The standoff may be formed with a punch and die assembly into any shape which provides the required gap. The mechanically formed standoff may also be covered with bonding material other than solder, e.g. gold, to accommodate other types of joints.

In one aspect of the invention, the standoffs are formed directly through a bonding pad of a circuit interconnect for electrically interconnecting a signal producing source with a signal processing source in a mass storage device. The circuit interconnect comprises a base material characterized by the ability to be formed into a standoff and maintain that shape.

In another aspect of the invention, at least two standoffs are formed adjacent each bonding pad of a circuit interconnect.

In yet another aspect of the invention, standoffs are formed on a flexure/conductor structure of a hard disk drive which includes a base; a data storage disk rotatably mounted to the base and rotated by disk motor means; a read/write head for reading information from and writing information to the storage disk; a moveable actuator mounted to the base for selectively positioning the head relative to a radius of the storage disk; a signal processing circuit mounted on the actuator for communicating with the read/write head; an integrated flexure/conductor suspension attached to the actuator for supporting the head adjacent to the storage disk and for electrically interconnecting the head to a signal processing circuit, the suspension comprising:

a generally planar conductive load beam structure having a proximal actuator mounting end and a gimbaled head mounting region at a distal end for attaching the head, a plurality of standoffs formed into the load beam structure providing means for electrical traces defined on the load beam to be electrically connected with the read/write head and the signal processing circuit.

These and other objects, advantages, aspects and features of the present invention, will be more fully appreciated and understood upon consideration of the following detailed description of preferred embodiments presented in conjunction with the accompanying drawings.

BRIEF DESCRIPTION OF THE DRAWINGS

FIG. 6b is an enlarged side cross-sectional view of an alternative embodiment of the standoff of FIG. 6a.

FIG. 6d is a side cross-sectional view of another alternative embodiment of the standoff of FIG. 6a.

FIG. 6e is a side cross-sectional view of another alternative embodiment of the standoff of FIG. 6a.

DETAILED DESCRIPTION OF A PREFERRED EMBODIMENT

Figure 3:
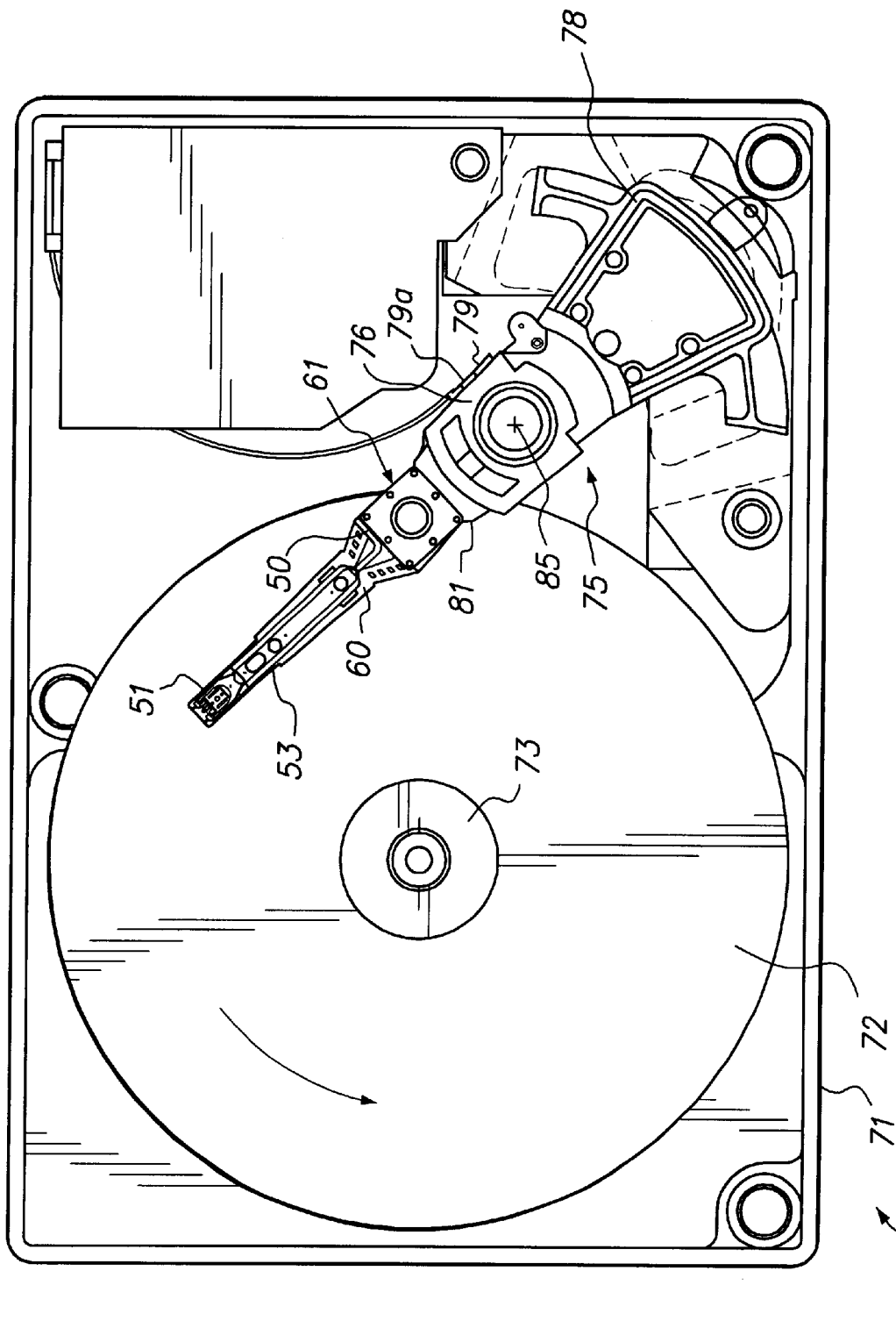
FIG. 3 is a top plan view of a disk drive including the integrated interconnect/suspension assembly of FIG. 4, incorporating principles of the present invention.

FIG. 3 shows a diagrammatic top plan view of the hard disk drive 70 including an integrated circuit interconnect 50 embodying principles of the present invention. Disk drive 70 includes a rigid base 71, supporting a spindle 73 (and a spindle motor, not shown) for rotating at least one data storage disk 72 in a direction shown by the curved arrow. Drive 70 also includes a rotary actuator assembly 75 rotationally mounted to the base 71 at a pivot point 85. The actuator assembly 75 includes a voice coil 78 which, when selectively energized by control circuitry 79, moves and thereby positions an actuator E-block 76 and head arms 81 and load beam assemblies 60 at radial track positions defined on the facing surfaces of storage disk 72. At least one of the load beam assemblies 60 is secured at its proximal end 61 to a distal end of head arm 81, e.g. by conventional ball-swaging techniques.

Conventionally, but not necessarily, two load beam assemblies 60 are attached to head arms 81 between disks 72. and one load beam structure 60 is attached to head arm 81 above and below the uppermost and lower most disks of a disk stack comprised of multiple disks 72 spaced apart on spindle 73.

Figure 4:
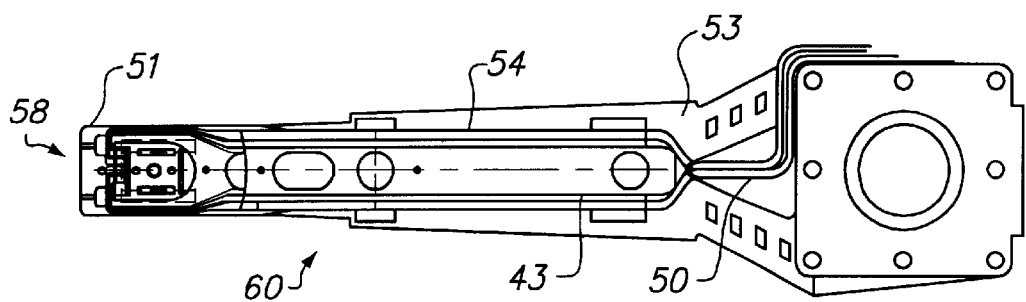
FIG. 4 is an enlarged diagrammatic plan view of the integrated flexure/conductor load beam structure, shown in FIG. 3, having standoffs mechanically formed therein, in accordance with principles of the present invention.

As shown in FIG. 4, the load beam assembly 60 includes a generally planar formed stainless steel load beam 53 and a flexure 54. In the present example, the flexure 54 is formed of thin stainless steel sheet material which is e.g. approximately 20-microns thick. An array of conductive traces 43 form part of an interconnect structure 50 which extends longitudinally from the slider supporting distal end 58 of flexure 54 to a connection pad array (not shown) located at a ceramic hybrid circuit substrate 79 secured to a side of the E-block 76 (shown in FIG. 3). The ceramic hybrid circuit 79 secures and connects a semiconductor chip forming a read preamplifier/write driver integrated circuit 79a. The transducer head slider 51 is attached to a gimbal by a suitable adhesive at the distal end 58 of the load beam assembly 60.

Figure 5A:
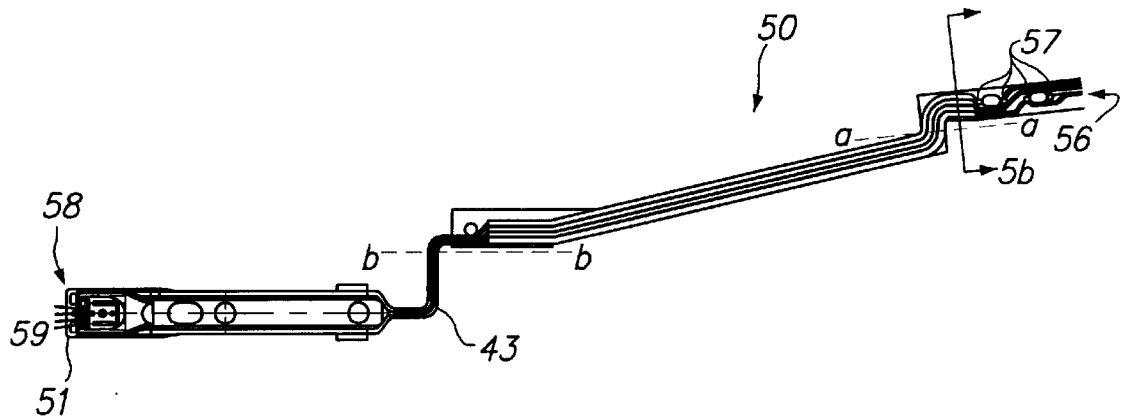
FIG. 5a is an enlarged plan view of the interconnect structure of FIG. 4, showing the connection pads and the standoffs formed therein.

As shown in FIG. 5a, interconnect 50 includes connection pads 59 located at the distal end 58 of the structure for connection to four aligned bonding pads of a dual-element (four conductor) thin film magneto-resistive read/write head 51 formed on a trailing edge of a slider body. Preferably, although not necessarily, the read/write head 51 is carried by a 30% slider body (also known as a "pico slider"). In addition, interconnect 50 includes connection pads 57 located at the proximal end 56 of the interconnect 50 for connection to four aligned bonding pads of the preamplifier integrated circuit 79a. During the assembly of disk drive 70, interconnect 50 is adhesively attached to the load beam 53, the side of head arm 81 by perpendicularly folding interconnect 50 along line b—b, then to the side of E-block 76 by again folding the proximal end 56 along line a—a. In the present example, connection with the head 51 and preamplifier integrated circuit 79a is made by solder reflow.

Figure 5B:
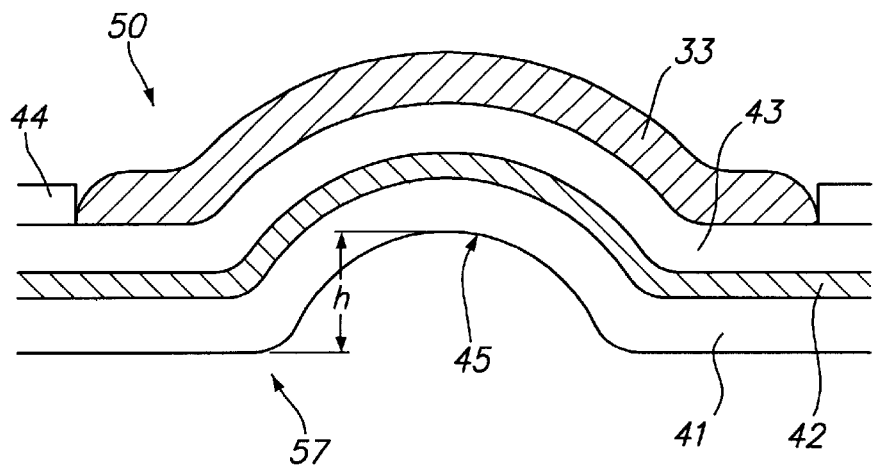
FIG. 5b is a greatly enlarged side cross-sectional view of a standoff mechanically formed through a connection pad shown in FIG. 5a, in accordance with principles of the present invention.

In accordance with principles of the present invention, each connection pad 57 and 59 of interconnect 50 includes standoffs mechanically formed therein. As shown in the cross sectional view of FIG. 5b, a spherical shaped standoff 45 is formed through the center of connection pad 57. The standoff 45 may be formed, to a height h, into interconnect 50 with any suitable means such as a punch and die assembly. In the present example, a standoff height h of 50 microns was preferred. As shown, the standoff 45 is coated with a layer of solder 33, which covers the conductive trace 43. Interposed between the conductive trace 43 and a stainless steel base 41, is a high dielectric polyimide film layer 42. Note also that a second insulating layer 44 masks the conductive traces 43 around the standoff area to prevent solder from flowing away therefrom and from bridging adjacent traces.

Figure 1A:
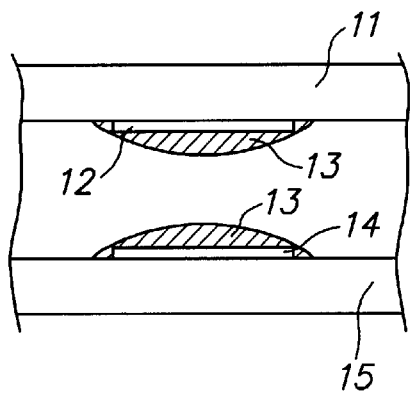
FIG. 1a is an enlarged side cross-sectional view of a prior art solder covered bonding pads, shown in position to be soldered.
Figure 1B:
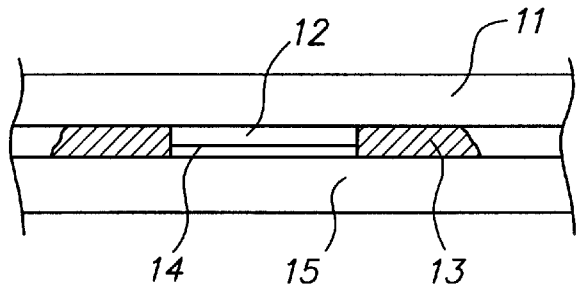
FIG. 1b is an enlarged side cross-sectional view of the prior art solder covered bonding pads of FIG. 1a, shown soldered together.
Figure 2A:
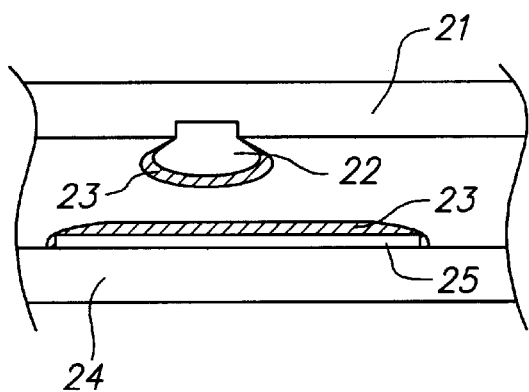
FIG. 2a is an enlarged side cross-sectional view of the prior art solder bump, shown in position to bond with a solder cover bonding pad.
Figure 2B:
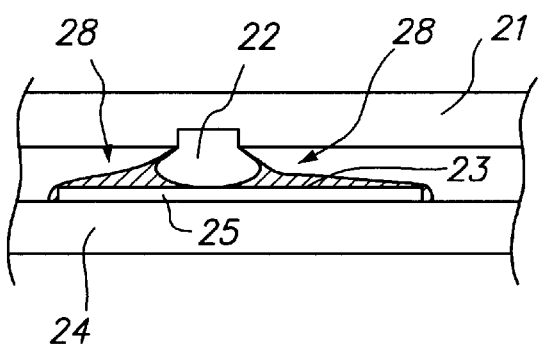
FIG. 2b is an enlarged side cross-sectional view of the prior art solder bump of FIG. 2a, shown soldered to the bonding pad.
Figure 6A:
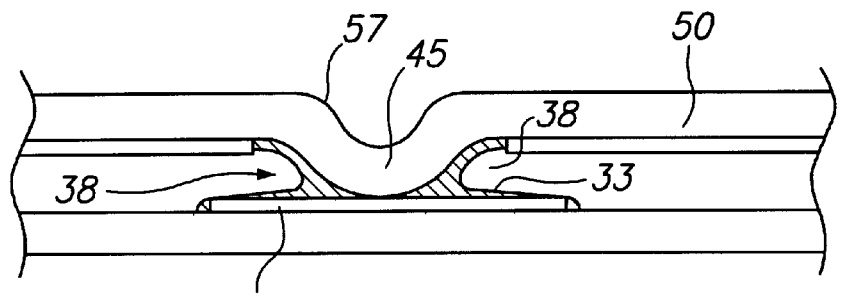
FIG. 6a is an enlarged side cross-sectional view of the standoff of FIG. 5b, shown soldered to an aligned bonding pad.

FIG. 6a shows the connection of connection pad 57 to an aligned bonding pad 35 of the preamplifier integrated circuit 79a and the resulting formation of the reflowed solder 33. Note that the standoff 45 actually provides a mechanical means for preventing the reflowed solder from flowing away from the bonding pad 35 and standoff 45. Specifically, the single point contact between the standoff 45 and the bonding pad 35 creates a gap 38 therein between for the reflowed solder to form a fillet. Advantageously, solder solidifies around the standoff 45 rather than outside the bonding pad area, as was the case in the prior solder joint shown in FIG. 1b. Thus, the mechanically formed standoff 45 provides the same advantages of the solder bumps of FIG. 2a, without the additional manufacturing costs associated therewith.

FIG. 6a is also representative of the other connection pads of interconnect 50 being soldered to an aligned bonding pad. Thus a separate discussion of each connection pad is unnecessary and the foregoing discussion of connection pad 57 applies to the other connection pads as well.

Another advantage the standoff 45 provides is that during the manufacturing of the disk drive 70, the soldering junction between the interconnect 50 and the read/write head 51 as well as the preamplifier integrated circuit 79a may be reworked without degrading the integrity of those parts. Rework is a manufacturing process of repairing defectively manufactured components without destroying that component. Thus the ability to rework is a money saving advantage to manufacturers. Because rework is well known to those skilled in the art, the steps involved in reworking solder joints will not be described herein. However, it should be understood that mechanically formed standoffs advantageously provide a reworkable soldering process.

Depending on the application, various shapes of dies may be used to form standoffs of various shapes and sizes. For example FIG. 6d shows a cylindrical shaped standoff 39 with a planar contact surface 39a. It should be understood that the scope of the present invention is not limited by any particular shape of the standoff. The important requirement is that the standoff create a gap between itself and the corresponding bonding pad that enables sufficient solder (or other bonding material) to solidify therein between. Preferably, a standoff providing a single point contact with the planar joining bonding pad, such as the spherical shaped standoff 45 of FIG. 6a, creates the largest gap therein between and prevents the least amount of solder from flowing away from the joint. Alternatively, a wedge-shaped standoff, formed through a connection pad and shown in the cross sectional view of FIG. 6e, provides a single line of contact with the aligned planar bonding pad and may achieve a similar effect.

Figure 6B:
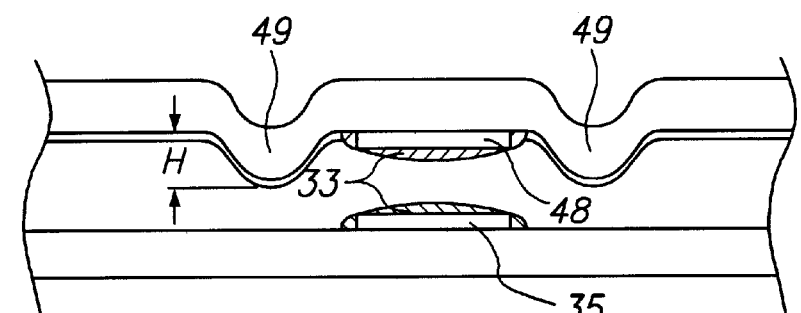
Figure 6C:
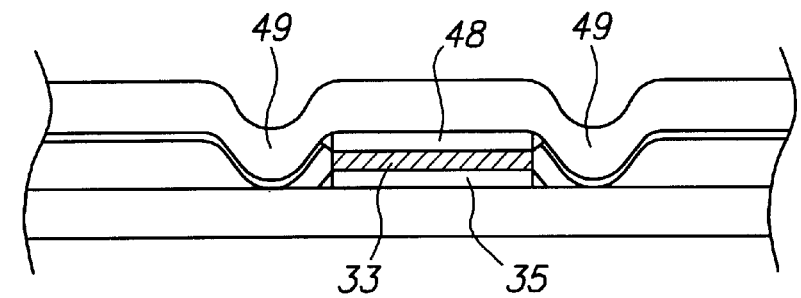
FIG. 6c is an enlarged side cross-sectional view of the alternative embodiment standoff of FIG. 6b, shown soldered to an aligned bonding pad.
Figure 6D:
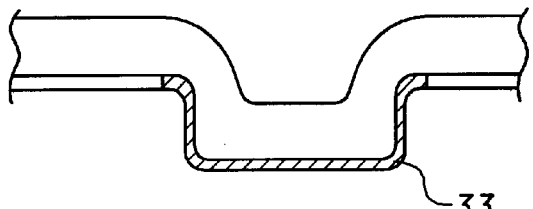
Figure 6E:
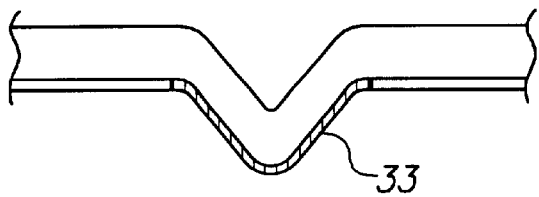

As an alternative to the single standoff illustrated in FIG. 6a, FIG. 6b illustrates a two standoff embodiment. As shown, instead of forming a standoff through a bonding pad, at least two standoffs 49 may be formed on opposite sides of a connection pad 48 of an interconnect. In this embodiment, the standoffs are not covered with solder and are formed with a sufficient height H so as to provide the necessary space for sufficient solder 33 to form a reliable joint, as illustrated in FIG. 6c. In one embodiment, a standoff height H of 50 microns was determined to be sufficient for enabling sufficient solder to form therein between.

In other embodiments of the present invention, standoffs may be mechanically formed into other circuit interconnects, similar to interconnect 50 of FIG. 5, wherein the interconnect is used to connect a signal producing source with a signal processing source in a mass storage device, e.g. magnetic tape drive. The shape and material comprising other interconnects may not be the same as FIG. 5. The important criteria is that the interconnect include some layer of material having the ability to be formed into a standoff and to maintain that shape.

It should be understood that the layer of solder covering each standoff may be applied by any suitable means known to those skilled in the art e.g. plating, screening, depositing, etc. In addition, solder may be applied prior to or after the formation of each standoff. It should also be understood that other materials may be used in the fabrication of the electrical interconnect 50 i.e. the different layers of material shown in FIG. 5b. (For example, Bennin et al. teaches using Beryllium Copper traces.)

The present invention has been described with the standoffs covered with solder. However, it should be understood that other conductive material may be used to cover the standoff and its aligned bonding pad. For example, the standoff and/or the aligned bonding pad may be covered with gold for ultrasonic bonding.

To those skilled in the art, many changes and modifications will be readily apparent from consideration of the foregoing description of a preferred embodiment without departure from the spirit of the present invention, the scope thereof being more particularly pointed out by the following claims. The descriptions herein and the disclosures hereof are by way of illustration only and should not be construed as limiting the scope of the present invention which is more particularly pointed out by the following claims.

What is claimed is:

1. An electrical circuit interconnect for a storage device, the storage device having a bonding pad, the electrical circuit interconnect comprising:

a connection pad that is adapted to be bonded to the bonding pad, the connection pad including (i) a substrate, (ii) a portion of an electrical trace positioned near the substrate, and (iii) a standoff having a raised portion that is formed by deforming the substrate to form an indentation in a direction toward the bonding pad, the standoff being positioned near the bonding pad when the connection pad is bonded to the bonding pad.

2. The electrical circuit interconnect of claim 1 wherein the standoff is formed in the substrate without substantially increasing the thickness of the connection pad.

3. The electrical circuit interconnect of claim 1 wherein the standoff is formed with a die.

4. The electrical circuit interconnect of claim 1 wherein the standoff has a shape that forms a portion of a sphere.

5. The electrical circuit interconnect of claim 1 wherein the standoff is substantially conical in shape.

6. The electrical circuit interconnect of claim 1 wherein the standoff has a roughly rectangular cross-sectional shape.

7. The electrical circuit interconnect of claim 1 wherein the standoff is substantially wedge-shaped.

8. The electrical circuit interconnect of claim 1 wherein the standoff is formed by also deforming the electrical trace to form an indentation in the electrical trace.

9. The electrical circuit interconnect of claim 1 wherein a layer of solder substantially covers the portion of the electrical trace near the raised portion.

10. The electrical circuit interconnect of claim 1 wherein the indentation has a height of at least approximately 50 microns.

11. A storage device comprising:

a signal producing source and a signal processing source, at least one of the sources including a bonding pad; and an electrical circuit interconnect including a connection pad that is secured to the bonding pad, the connection pad having (i) a substrate, (ii) a portion of an electrical trace positioned near the substrate, and (iii) a standoff having a raised portion that is formed by deforming the substrate to form an indentation in a direction toward the bonding pad, the raised portion being positioned near the bonding pad.

12. An electrical circuit interconnect for a storage device, the storage device having a signal producing source and a signal processing source, at least one of the sources including a bonding pad, the electrical circuit interconnect comprising:

a connection pad that is adapted to be bonded to the bonding pad, the connection pad comprising a substrate and a portion of an electrical trace positioned near the substrate;

wherein the substrate includes an indentation that forms a standoff positioned near the bonding pad when the connection pad is bonded to the bonding pad, the indentation defining an empty cavity in the substrate, the standoff including a raised portion positioned near the electrical trace.

13. The electrical circuit interconnect of claim 12 wherein the raised portion is formed by deforming the substrate.

14. The electrical circuit interconnect of claim 12 wherein the standoff is formed with a die.

15. The electrical circuit interconnect of claim 12 wherein the standoff is formed in the substrate without substantially increasing the thickness of the connection pad.

16. The electrical circuit interconnect of claim 12 wherein the standoff is formed by also deforming the portion of the electrical trace to form an indentation in the electrical trace.

17. The electrical circuit interconnect of claim 12 wherein a layer of solder substantially covers the portion of the electrical trace.

18. A storage device comprising:

a signal producing source and signal processing source, at least one of the sources including a bonding pad; and an electrical circuit interconnect including a connection pad that is secured to the bonding pad, the connection pad comprising (i) a substrate having an indentation that defines an empty cavity in the substrate, the indentation forming a standoff, the standoff including a raised portion that is positioned near the bonding pad, and (ii) a portion of an electrical trace positioned near the raised portion.

19. A method of manufacturing an electrical circuit interconnect for a storage device, the storage device having a signal producing source and a signal processing source, at least one of the sources including a bonding pad, the method comprising the steps of:

providing a connection pad including a substrate, a portion of an electrical trace, and a standoff that is formed by deforming the substrate, the standoff being positioned near the bonding pad of one of the sources;

positioning the portion of the electrical trace adjacent to the substrate, the electrical trace forming a signal path that is adapted to electrically connect the signal producing source with the signal processing source; and securing the connection pad to the bonding pad of one of the sources.

20. The method of claim 19 wherein the step of providing a connection pad includes the step of using a die to deform the substrate.

21. A method for manufacturing a storage device, the method comprising the steps of:

providing a signal producing source and a signal processing source, at least one of the sources including a bonding pad;

providing a connection pad including a substrate, a portion of an electrical trace, and a standoff that is formed by deforming the substrate, the standoff being positioned near the bonding pad of one of the sources;

positioning the portion of the electrical trace near the substrate, the electrical trace forming a signal path that is adapted to electrically connect the signal producing source with the signal processing source; and bonding the connection pad to the bonding pad of one of the sources.

22. A method of manufacturing an electrical circuit interconnect for a storage device, the storage device having a signal producing source and a signal processing source, at least one of the sources including a bonding pad, the method comprising the steps of:

deforming a substrate to form a standoff having a raised portion that is positioned near the bonding pad of one of the sources;

positioning a portion of an electrical trace near the substrate, the electrical trace forming a signal path that is adapted to electrically connect the signal producing source with the signal processing source; and coupling the electrical trace to the bonding pad positioned near the raised portion.

23. The method of claim 22 wherein the step of deforming the substrate includes forming the standoff by indenting the substrate so that the standoff defines an empty cavity, the standoff being formed in a direction towards the bonding pad.

24. The method of claim 22 wherein the step of forming the standoff includes the step of using a die to deform the substrate.

25. The method of claim 22 wherein the step of coupling the electrical trace includes using solder.

* * * * *